(12) United States Patent
Abdelghafar

(10) Patent No.: US 12,166,144 B2
(45) Date of Patent: Dec. 10, 2024

(54) PHOTOELECTRIC CONVERSION DEVICE, PHOTOELECTRIC CONVERSION SYSTEM, AND MOVING BODY

(71) Applicant: CANON KABUSHIKI KAISHA, Tokyo (JP)

(72) Inventor: Ayman Tarek Abdelghafar, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 434 days.

(21) Appl. No.: 17/574,651

(22) Filed: Jan. 13, 2022

(65) Prior Publication Data
US 2022/0238743 A1    Jul. 28, 2022

(30) Foreign Application Priority Data

Jan. 22, 2021   (JP) ................................ 2021-008942

(51) Int. Cl.
*H01L 31/107*   (2006.01)
*H01L 27/146*   (2006.01)
*H01L 31/02*    (2006.01)

(52) U.S. Cl.
CPC ...... *H01L 31/107* (2013.01); *H01L 27/14636* (2013.01); *H01L 31/02002* (2013.01)

(58) Field of Classification Search
CPC ........... H01L 27/1446; H01L 27/14621; H01L 27/1463; H01L 27/14645; H01L 27/14636; H01L 31/02027; H01L 31/02005; H01L 31/022416; H01L 31/035272; H01L 31/03529; H01L 31/107; B60R 11/04;
(Continued)

(56) References Cited

U.S. PATENT DOCUMENTS 10,680,028 B2   6/2020   Kobayashi et al.
10,811,544 B2   10/2020  Ota
(Continued)

FOREIGN PATENT DOCUMENTS

JP    2018-157387 A    10/2018
JP    2018-201005 A    12/2018
(Continued)

OTHER PUBLICATIONS

Office Action dated Oct. 21, 2024, in Japanese Patent Application No. 2021-008942.

*Primary Examiner* — Brook Kebede
(74) *Attorney, Agent, or Firm* — Venable LLP

(57) ABSTRACT

Photoelectric conversion device includes first region of first conductivity type arranged in semiconductor layer having first second surfaces, second region of second conductivity type arranged between the second surface and the first region and forming avalanche photodiode, separation region of the second conductivity type arranged between the first and second surfaces to surround the second region, contact region of the second conductivity type contacted to the separation region, first contact plug connected to the first region, and second contact plug connected to the contact region. The second region has shape of rectangle, and the second contact plug is arranged in diagonal direction of the rectangle. Distance between center of the first contact plug and center of the second contact plug is larger than distance between center of the second region and the center of the second contact plug.

19 Claims, 13 Drawing Sheets

(58) Field of Classification Search
CPC ...... B60W 30/00; G01S 17/10; G01S 7/4816; G01S 7/4861
See application file for complete search history.

(56) References Cited

U.S. PATENT DOCUMENTS

| | | | |
|---|---|---|---|
| 11,222,916 | B2 | 1/2022 | Kobayashi et al. |
| 11,309,440 | B2 | 4/2022 | Ota |
| 11,362,231 | B2 | 6/2022 | Sasago et al. |
| 11,699,716 | B2 | 7/2023 | Kobayashi et al. |
| 2018/0108800 | A1* | 4/2018 | Morimoto ......... H01L 31/02005 |
| 2019/0006399 | A1 | 1/2019 | Otake et al. |
| 2019/0267414 | A1 | 8/2019 | Otake et al. |
| 2019/0319154 | A1* | 10/2019 | Fukuchi ............ H01L 27/14621 |
| 2020/0028018 | A1* | 1/2020 | Iwata ...................... G01S 17/89 |
| 2020/0091208 | A1 | 3/2020 | Otake et al. |
| 2020/0321369 | A1 | 10/2020 | Otake et al. |

FOREIGN PATENT DOCUMENTS

| | | |
|---|---|---|
| JP | 2019-033136 A | 2/2019 |
| JP | 2020-057651 A | 4/2020 |

\* cited by examiner

PHOTOELECTRIC CONVERSION DEVICE, PHOTOELECTRIC CONVERSION SYSTEM, AND MOVING BODY

BACKGROUND OF THE INVENTION

Field of the Invention

The present invention relates to a photoelectric conversion device, a photoelectric conversion system, and a moving body.

Description of the Related Art

There is known a light detection device that can detect weak light of a single photon level using avalanche (electron avalanche) multiplication. Japanese Patent Laid-Open No. 2018-201005 discloses a SPAD (Single Photon Avalanche Diode) in which photo charges generated by a single photon cause avalanche multiplication in the p-n junction region of semiconductor regions forming a photoelectric converter.

SUMMARY OF THE INVENTION

The invention provides a technique advantageous in suppressing the increase of the dark count rate (to be referred to as the DCR hereinafter) caused by a high electric field in an avalanche photodiode (to be referred to as an APD hereinafter).

One of aspects of the invention provides a photoelectric conversion device comprising: a first region of a first conductivity type arranged in a semiconductor layer having a first surface and a second surface; a second region of a second conductivity type arranged between the second surface and the first region and forming an avalanche photodiode together with the first region; a separation region of the second conductivity type arranged between the first surface and the second surface to surround the second region in an orthogonal projection with respect to the first surface; a contact region of the second conductivity type arranged to contact the separation region; a first contact plug connected to the first region; and a second contact plug connected to the contact region, wherein the second region has a shape of a rectangle, and the second contact plug is arranged in a diagonal direction of the rectangle, and in the orthogonal projection with respect to the first surface, a distance between a center of the first contact plug and a center of the second contact plug is larger than a distance between a center of the second region and the center of the second contact plug.

Further features of the present invention will become apparent from the following description of exemplary embodiments with reference to the attached drawings.

DESCRIPTION OF THE EMBODIMENTS

Figure 1:
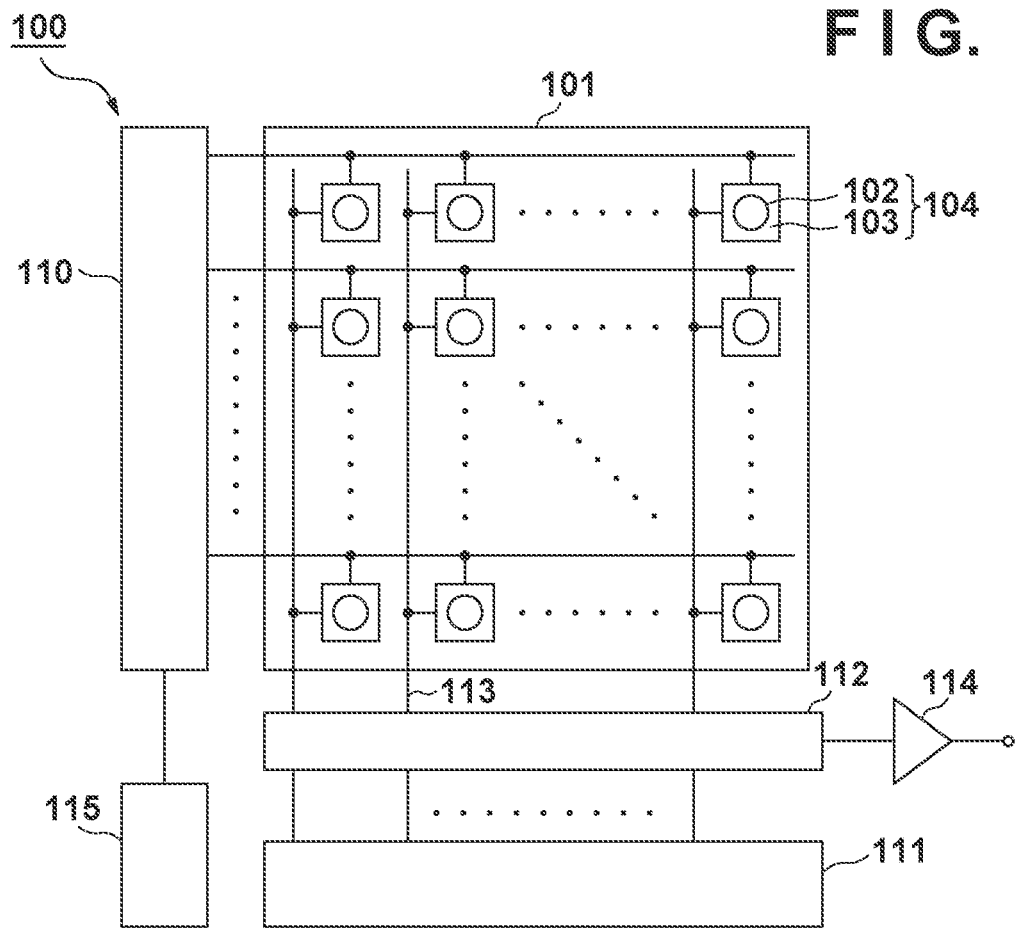
FIG. 1 is a view exemplifying the arrangement of a photoelectric conversion device according to an embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

FIG. 1 exemplifies the arrangement of a photoelectric conversion device 100 according to an embodiment. Referring to FIG. 1, the photoelectric conversion device 100 can include a pixel array 101, a controller 115, a horizontal scanning circuit 111, a readout circuit 112, a plurality of signal lines 113, and a vertical scanning circuit 110. In the pixel array 101, a plurality of pixels 104 can be arranged to form a plurality of rows and a plurality of columns. Each pixel 104 can include a photoelectric converter 102 with an APD (avalanche photodiode) and a signal processor 103. The photoelectric converter 102 converts light into an electrical signal. The signal processor 103 can be configured to output, to the readout circuit 112, a signal obtained by processing the electrical signal output from the photoelectric converter 102. The signal processor 103 can include, for example, a counter and a memory. The memory can store a digital value.

The vertical scanning circuit 110 can be configured to receive a control signal supplied from the controller 115 and to supply a control pulse to each pixel 104. The vertical scanning circuit 110 can include, for example, a shift register and an address decoder. The vertical scanning circuit 110 can be configured to select the plurality of pixels 104 of the pixel array 101 on the row basis. The signal processors 103 of the plurality of pixels 104 belonging to the row selected by the vertical scanning circuit 110 output signals to a corresponding one of the plurality of signal lines 113.

The horizontal scanning circuit 111 can be configured to scan the plurality of signal lines 113 so as to select, among the plurality of signal lines 113, the signal line 113 from which the readout circuit 112 is to read out the signals. The readout circuit 112 can supply, to an output circuit 114, the signals of the signal line 113 selected by the horizontal scanning circuit 111. The output circuit 114 can output the signals, supplied from the readout circuit 112, to an external device or a device incorporated in the photoelectric conversion device 100, for example, a recording unit or a processor.

FIG. 1 shows an example in which the plurality of pixels 104 are two-dimensionally arranged but the plurality of pixels 104 may be one-dimensionally arranged. Furthermore, the pixel array 101 may be replaced by one pixel 104. The function of the signal processor 103 need not always be individually provided in each of all the pixels 104. For example, at least two pixels 104 may share one signal processor 103, and signals output from the photoelectric converters 102 of the at least two pixels 104 may sequentially be processed by the shared signal processor 103.

Figure 2:
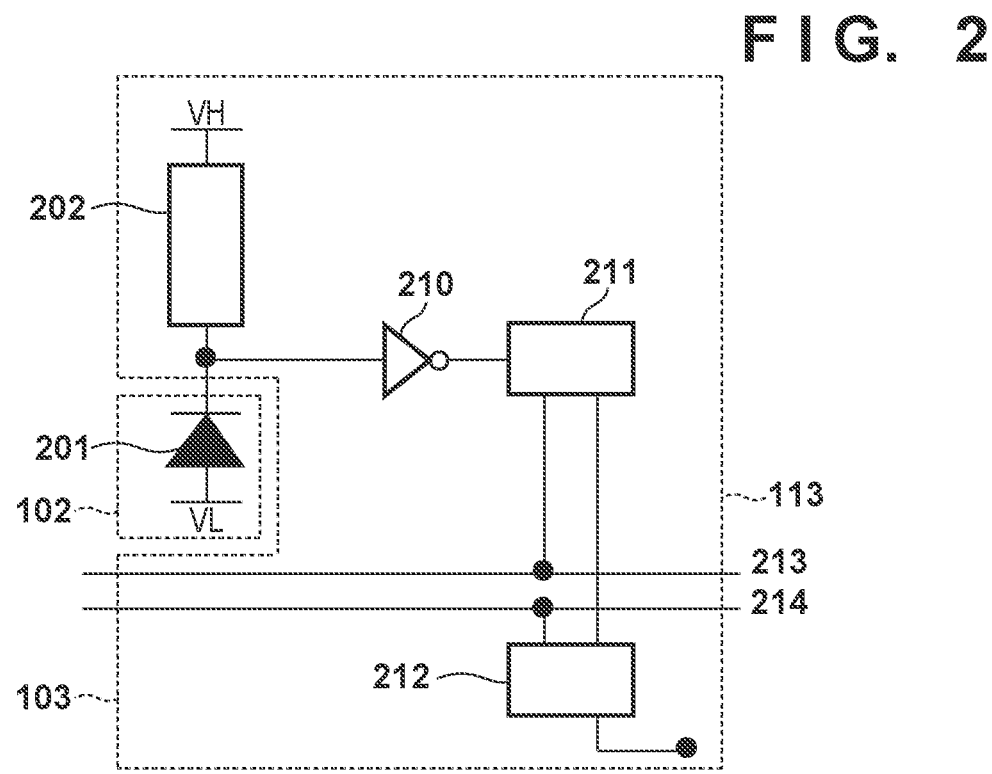
FIG. 2 is a view exemplifying the arrangement of one pixel shown in FIG. 1.

FIG. 2 exemplifies the arrangement of one pixel 104. The photoelectric converter 102 includes an APD 201. The APD 201 photoelectrically converts incident light to generate charge pairs. The anode of the APD 201 can be supplied with a voltage VL. The cathode of the APD 201 can be supplied with a voltage VH higher than the voltage VL supplied to the anode. The anode and the cathode are supplied with a reverse bias voltage that causes the APD 201 to perform an avalanche multiplication operation. If light enters the APD 201 in the state in which such voltage is supplied, charges generated by the light cause avalanche multiplication, thereby generating an avalanche current. When a reverse bias voltage is supplied, there are a Geiger mode operating in a state in which the potential difference between the anode and the cathode is larger than the breakdown voltage and a linear mode operating in a state in which the potential difference between the anode and the cathode is around or smaller than the breakdown voltage. An APD operated in the Geiger mode is called a SPAD. For example, the voltage VL is −30 V and the voltage VH is 1 V.

A quenching element 202 can be arranged to connect a power supply line for supplying the voltage VH and the cathode of the APD 201. The quenching element 202 has a function of converting, into a voltage, a change of the avalanche current generated in the APD 201. The quenching element 202 functions as a load circuit (quenching circuit) at the time of signal multiplication by avalanche multiplication, and performs an operation (quenching operation) of suppressing avalanche multiplication by decreasing the voltage supplied to the APD 201.

The signal processor 103 can include, for example, a waveform shaper 210, a counter circuit 211, and a selection circuit 212. The waveform shaper 210 outputs a pulse signal by shaping the potential change waveform of the cathode of the APD 201 obtained at the time of detection of a photon. The waveform shaper 210 can include, for example, an inverter circuit. FIG. 2 shows an example in which the waveform shaper 210 is formed by one inverter. However, the waveform shaper 210 may be formed by series-connecting a plurality of inverters or by another circuit having a waveform shaping effect. The counter circuit 211 can count the pulse signal output from the waveform shaper 210, and hold a thus obtained count value. Furthermore, when the counter circuit 211 is supplied with a control pulse pRES from the vertical scanning circuit 110 via a driving line 213 (not shown in FIG. 1), it resets the held signal. When the selection circuit 212 is supplied with a control pulse pSEL from the vertical scanning circuit 110 via a driving line 214 (not shown in FIG. 1), it electrically connects the counter circuit 211 and the signal line 113. The selection circuit 212 may include, for example, a buffer circuit for driving the signal line 113. A switch such as a transistor may be arranged between the quenching element 202 and the photoelectric converter 102 (APD 201) and/or between the photoelectric converter 102 and the signal processor 103. A switch such as a transistor may be arranged in the supply path of the voltage VH or VL to the photoelectric converter 102.

In this embodiment, the arrangement using the counter circuit 211 is described. However, instead of the counter circuit 211, a time to digital converter (to be referred to as a TDC hereinafter) and a memory may be used. In this case, the photoelectric conversion device 100 can function as a photoelectric conversion device that acquires a pulse detection timing. In this case, the occurrence timing of the pulse signal output from the waveform shaper 210 can be converted into a digital signal by the TDC. The TDC can be supplied with a control pulse pREF (reference signal) from the vertical scanning circuit 110 via the driving line to measure the timing of the pulse signal. The TDC generates a digital signal indicating the input timing of the signal output from the waveform shaper 210 with reference to the control pulse pREF.

In the example of the arrangement shown in FIG. 2, the anode of the APD 201 is connected to the supply line of the voltage VL, the quenching element 202 is connected between the cathode of the APD 201 and the supply line of the voltage VH, and the cathode is connected to the input terminal of the waveform shaper 210. In this case, a signal charge is an electron. Instead of this arrangement, the cathode of the APD 201 may be connected to the supply line of the voltage VH, the quenching element 202 may be connected between the anode of the APD 201 and the supply line of the voltage VL, and the anode may be connected to the input terminal of the waveform shaper 210. In this case, a signal charge is a hole.

Figure 3A:
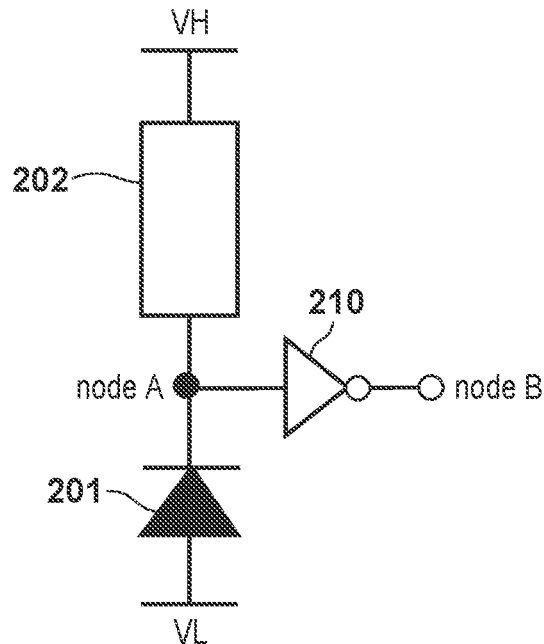
FIG. 3A shows views an APD.
Figure 3B:
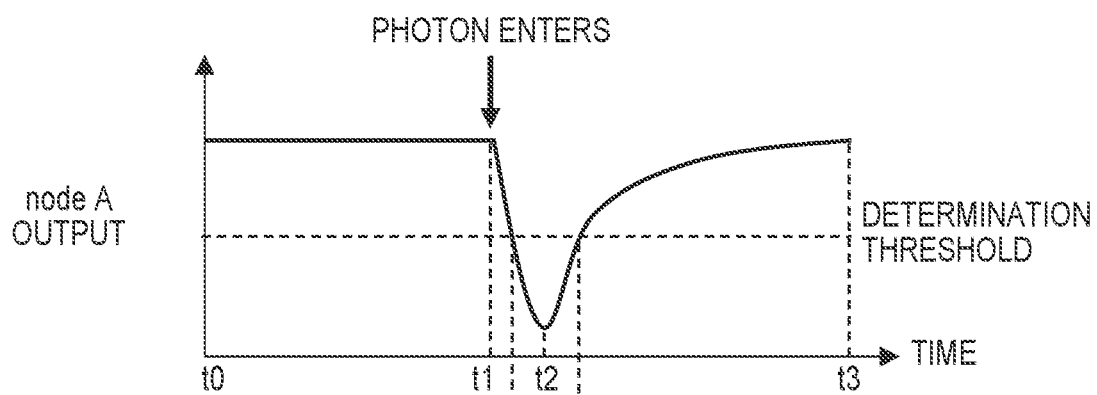
FIGS. 3B and 3C show exemplifying detection of a photon using the APD shown in FIG. 3A.
Figure 3C:
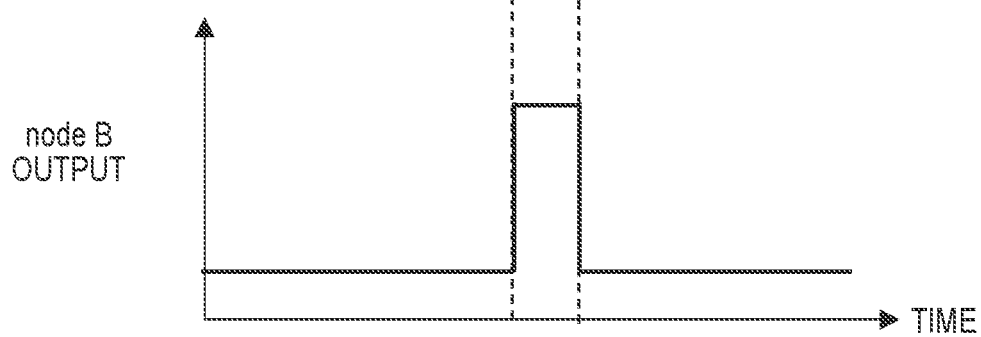

Detection of a photon using the APD 201 will be described with reference to FIGS. 3A to 3C. FIG. 3A shows the APD 201, the quenching element 202, and the waveform shaper 210 forming part of the pixel 104. The input side of the waveform shaper 210 is indicated by node A and the output side of the waveform shaper 210 is indicated by node B. FIG. 3B shows the voltage waveform of node A in FIG. 3A. FIG. 3C shows the voltage waveform of node B in FIG. 3A.

During a period from time t0 to time t1, a potential difference of VH−VL is applied to the APD 201 shown in FIG. 3A. When a photon enters at time t1, an avalanche multiplication current flows through the quenching element 202, thereby dropping the voltage of node A. If the voltage drop amount becomes larger and the potential difference applied to the APD 201 becomes smaller, the avalanche multiplication of the APD 201 stops, and the voltage level of node A does not drop to a value less than a given value. After that, a current that compensates for the voltage drop flows through node A, and node A is set to the original potential level at time t3. The voltage waveform of node A is shaped by the waveform shaper 210. More specifically, the waveform shaper 210 outputs a signal which is set to an active level in a portion where the voltage of node A exceeds a threshold.

Figure 4:
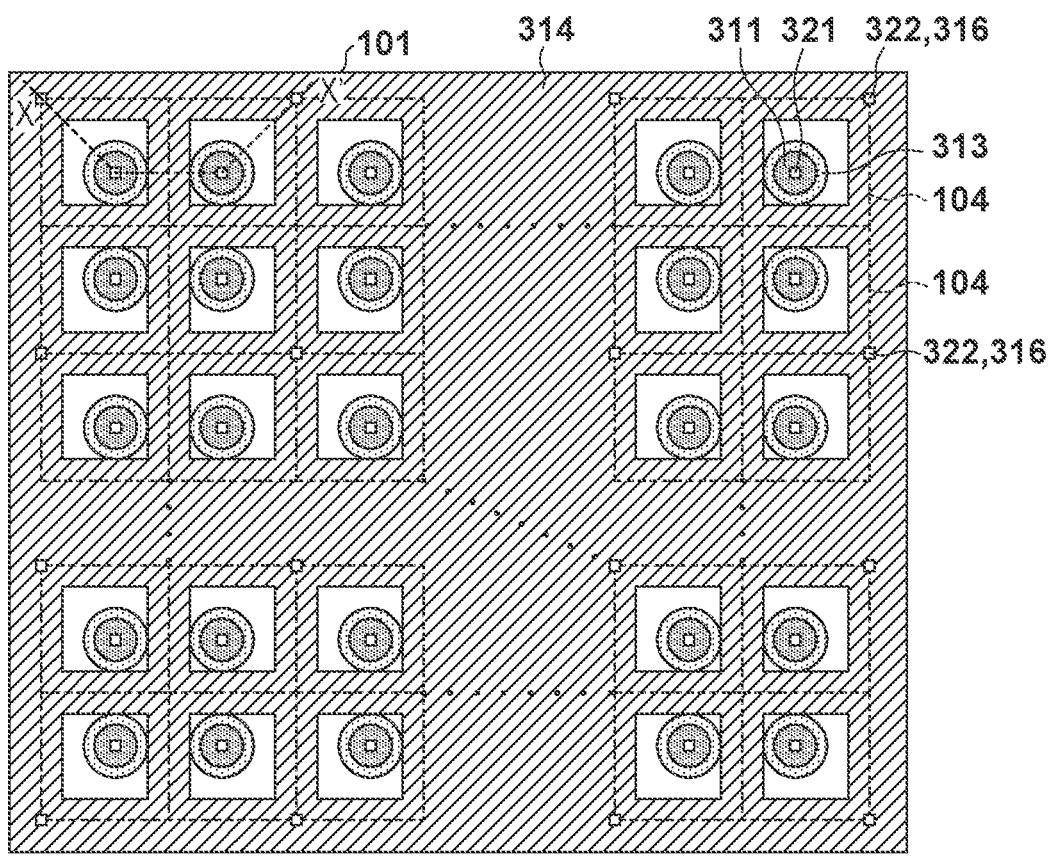
FIG. 4 is a plan view of a pixel array according to the first embodiment.

FIG. 4 shows a plan view or a planar view of the pixel array 101 according to the first embodiment.

Figure 5:
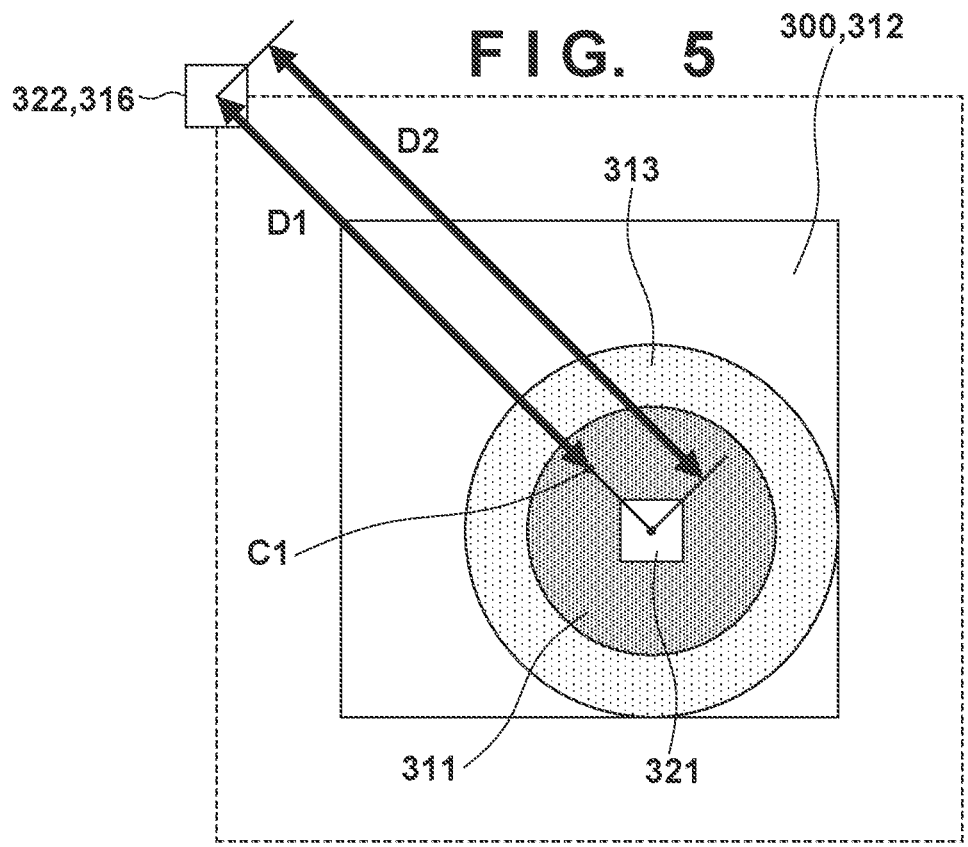
FIG. 5 is an enlarged view of a portion shown in FIG. 4.
Figure 6:
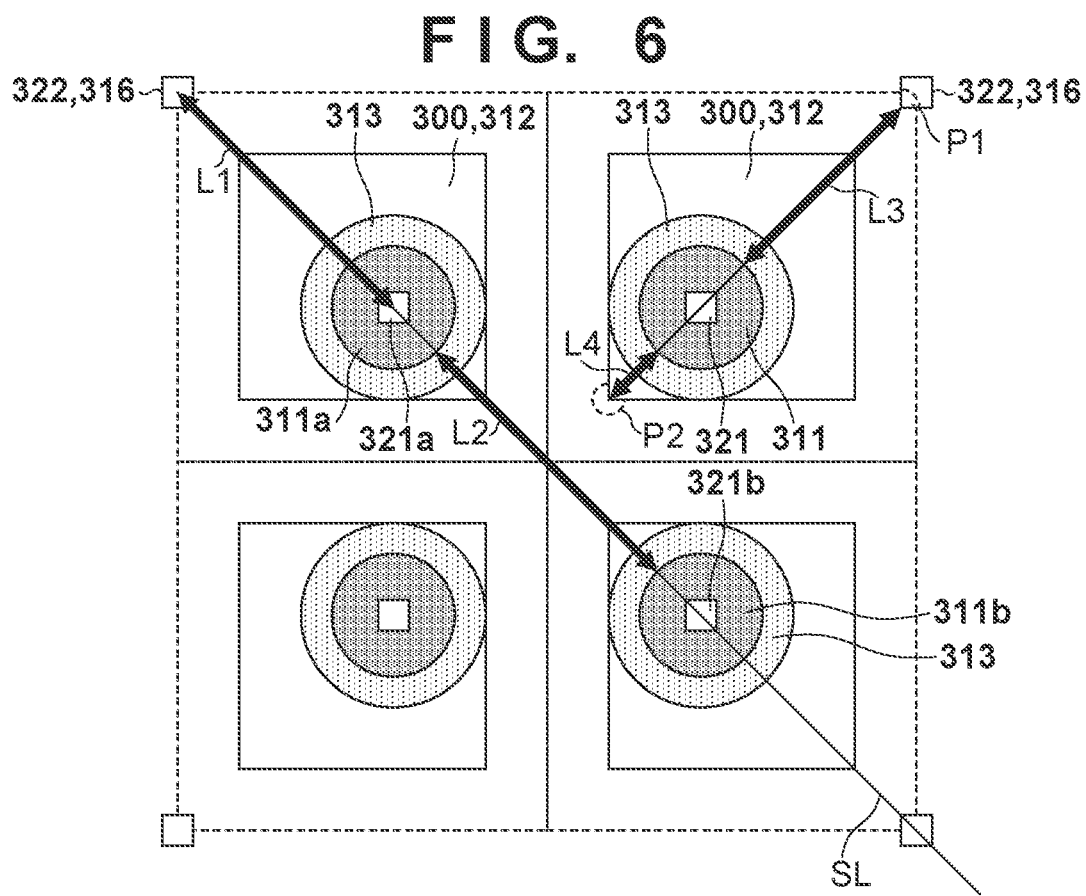
FIG. 6 is an enlarged view of a portion shown in FIG. 4.
Figure 7:
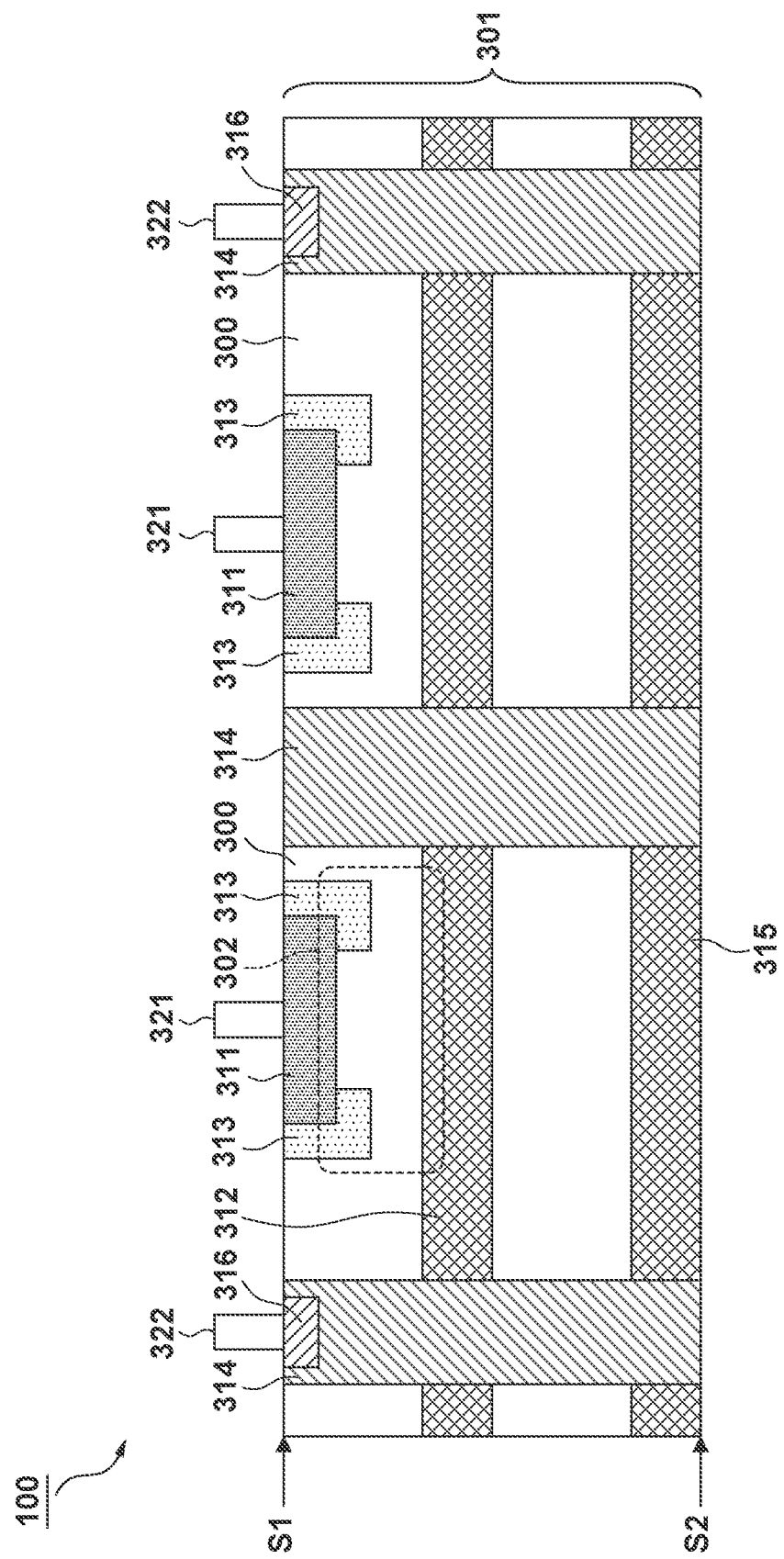
FIG. 7 is a sectional view taken along a line X-X' in FIG. 4.

FIGS. 5 and 6 each show an enlarged view of a portion in FIG. 4. FIG. 7 shows a sectional view taken along a line X-X' in FIG. 4. The photoelectric conversion device 100 includes a semiconductor layer 301 having a first surface S1 and a second surface S2. FIGS. 4 and 5 may be understood as an orthogonal projection with respect to the first surface S1 or the second surface S2. In the following description, the first conductivity type and the second conductivity type are different from each other. If the first conductivity type is an n type, the second conductivity type is a p type. If the first conductivity type is a p type, the second conductivity type is an n type. Note that referring to FIGS. 4, 5, 6, and 7, the signal processor 103 is not illustrated for the sake of descriptive simplicity. The same applies to the remaining drawings to be referred to hereinafter. A region of the first conductivity type and a region of the second conductivity type are both semiconductor regions, in other words, impurity semiconductor regions. In the following description, the impurity concentration of the region of the first conductivity type indicates a net impurity concentration obtained by subtracting the impurity concentration of the second conductivity type from the impurity concentration of the first conductivity type when the region includes an impurity of the second conductivity type in addition to an impurity of the first conductivity type. Similarly, the impurity concentration of the region of the second conductivity type indicates a net impurity concentration obtained by subtracting the impurity concentration of the first conductivity type from the impurity concentration of the second conductivity type when the region includes an impurity of the first conductivity type in addition to an impurity of the second conductivity type.

The pixel 104 can include a first region 311 of the first conductivity type, a second region 312 of the second conductivity type, a separation region 314 of the second conductivity type, and a contact region 316 of the second conductivity type. The first region 311 is arranged between the first surface S1 and the second surface S2 of the semiconductor layer 301. The second region 312 can be arranged between the second surface S2 of the semiconductor layer 301 and the first region 311. The second region 312 can be arranged apart from the first region 311. Note that the first region 311 and the second region 312 may contact each other. The second region 312 can form the APD 201 together with the first region 311. The first region 311 can be the cathode of the APD 201 and the second region 312 can be the anode of the APD 201. Alternatively, the first region 311 can be the anode of the APD 201 and the second region 312 can be the cathode of the APD 201.

In the plan view or the planar view (the orthogonal projection with respect to the first surface S1), the separation region 314 can be arranged between the first surface S1 and the second surface S2 to surround the second region 312. Furthermore, the separation region 314 can be arranged between the first surface S1 and the second surface S2 to surround the first region 311. The boundary of the separation region 314 may or may not include the first surface S1. The boundary of the separation region 314 may or may not include the second surface S2. The contact region 316 can be arranged to contact the separation region 314.

The impurity concentration of the second conductivity type of the contact region 316 may be higher than that of the second conductivity type of the separation region 314. The contact region 316 may be arranged so that its side surface is surrounded by the separation region 314 or contacts the separation region 314. The contact region 316 may be arranged to cover the entire region of the end face of the separation region 314 on the side of the first surface S1. The contact region 316 preferably has at least a portion that contacts the separation region 314. This can supply a potential to the separation region 314 from the second contact plug 322 (to be described later) via the contact region 316.

Furthermore, if the separation region 314 and the second region 312 contact each other, it is possible to supply a potential to the second region 312 via the separation region 314.

The pixel 104 can include a first contact plug 321 electrically connected to the first region 311. The pixel 104 can also include a second contact plug 322 electrically connected to the contact region 316. The pixel 104 may further include a ring-shaped region 313 of the first conductivity type. The impurity concentration of the first conductivity type of the ring-shaped region 313 may be lower than that of the first conductivity type of the first region 311. The ring-shaped region 313 can function to relax local concentration of an electric field in a region between the first region 311 and the separation region 314 and/or the contact region 316. The ring-shaped region 313 can be arranged to cover the side surface of the first region 311. The ring-shaped region 313 can be arranged not to cover the central portion of a surface facing the second region 312 among the surfaces of the first region 311 and to cover all or part of the peripheral portion outside the central portion. The second region 312 can be arranged apart from the ring-shaped region 313. The separation region 314 can be arranged apart from the ring-shaped region 313. Referring to FIGS. 4 to 6, the ring-shaped region 313 is a circle but may be a rectangle or polygon.

The pixel 104 may include a third region 300. The third region 300 can be a region of the first conductivity type arranged between the first region 311 of the first conductivity type and the second region 312 of the second conductivity type and between the ring-shaped region 313 of the first conductivity type and the second region 312 of the second conductivity type. In this case, the impurity concentration of the first conductivity type of the third region 300 is lower than that of the first conductivity type of the ring-shaped region 313. Alternatively, the third region 300 can be a region of the second conductivity type arranged between the first region 311 of the first conductivity type and the second region 312 of the second conductivity type and between the ring-shaped region 313 of the first conductivity type and the second region 312 of the second conductivity type. In this case, the impurity concentration of the second conductivity type of the third region 300 is lower than those of the second conductivity type of the second region 312 and the separation region 314.

The pixel 104 may further include a fourth region 315 of the second conductivity type. The fourth region 315 can be arranged between the second region 312 and the second surface S2. The boundary of the fourth region 315 may or may not include the second surface S2. A region of the second conductivity type having an impurity concentration lower than the impurity concentrations of the second conductivity type of the second region 312 and the fourth region 315 can be arranged between the second region 312 of the second conductivity type and the fourth region 315 of the second conductivity type. Alternatively, a region of the first conductivity type can be arranged between the second region 312 of the second conductivity type and the fourth region 315 of the second conductivity type. Charges generated in the region between the second region 312 and the fourth region 315 are collected to a strong electric field region formed by the first region 311 and the second region 312. Then, the generated charges cause avalanche multiplication in the strong electric field region. The fourth region 315 and the separation region 314 preferably contact each other. This surrounds the region between the second region 312 and the fourth region 315 by the second region 312, the separation region 314, and the fourth region 315, thereby making it easy to collect the generated charges to the strong electric field region.

The second contact plug 322 and the contact region 316 of the second conductivity type can be shared by at least two pixels 104, for example, four pixels 104. For example, the second contact plug 322 can be surrounded by the four pixels 104 and shared by the four pixels. From another viewpoint, the number of second contact plugs 322 is smaller than that of first contact plugs 321. The four pixels 104 sharing the second contact plug 322 can be arranged to have symmetry (point symmetry) with respect to the second contact plug 322. From another viewpoint, four adjacent pixels 104 which can arbitrarily be extracted can be arranged to have symmetry (point symmetry) with respect to the center of the four pixels. From another viewpoint, the second region 312 has a shape of a rectangle, and the second contact plug 322 assigned to the second region 312 can be arranged in one of the four diagonal directions of the second region 312.

Alternatively, the third region 300 has a shape of a rectangle, and the second contact plug 322 assigned to the third region 300 can be arranged in one of the four diagonal directions of the third region 300.

The first contact plug 321 electrically connected to the first region 311 forming the cathode can be supplied with the voltage VH via the quenching element 202. The second contact plug 322 electrically connected, via the separation region 314, to the second region 312 forming the anode can be supplied with the voltage VL lower than the voltage VH supplied to the cathode. The anode and the cathode can be supplied with a reverse bias voltage that causes the APD 201 to perform an avalanche multiplication operation. With this reverse bias voltage, in an avalanche multiplication region 302 between the first region 311 and the second region 312, charges generated by photoelectric conversion of incident light cause avalanche multiplication and an avalanche current thus flows.

If the distance between the first region 311 of the first conductivity type and the contact region 316 of the second conductivity type decreases along with reduction of the size of the pixel 104, a local high electric field region can be formed between the first region 311 and the contact region 316. The distance between the first region 311 of the first conductivity type and the contact region 316 of the second conductivity type should be made as large as possible.

As shown in FIG. 5, in the plan view or the planar view (the orthogonal projection with respect to the first surface S1), D2>D1 is preferably satisfied. D1 represents a distance between a center C1 of the second region 312 (third region 300) and the center of the second contact plug 322. D2 represents a distance between the center of the first contact plug 321 and the center of the second contact plug 322.

From another viewpoint, as shown in FIG. 6, in the plan view or the planar view (the orthogonal projection with respect to the first surface S1), L1>0.5L2 is preferably satisfied. L1 represents a distance between the center of the second contact plug 322 and the center of a first contact plug (to be referred to as "recent first contact plug" hereinafter) 321a closest to the second contact plug 322 among the plurality of first contact plugs 321. L2 represents a distance between a first region (to be referred to as "recent first region" hereinafter) 311a connected to the recent first contact plug 321a among the plurality of first regions 311 and a first region (to be referred to as "adjacent first region" hereinafter) 311b closest to the recent first region 311a among the plurality of first regions 311 on a straight line (straight line SL) passing through the center of the second contact plug 322 and the center of the recent first contact plug 321a.

From another viewpoint, as shown in FIG. 6, in the plan view or the planar view (the orthogonal projection with respect to the first surface S1), L3>L4 is preferably satisfied. In this example, L3 and L4 are located on a straight line passing through the contact region 316, a first portion P1 of the separation region 314 contacting the contact region 316, the first region 311, and a second portion P2 of the separation region 314. The first region 311 is located between the contact region 316 and the second portion P2 of the separation region 314. L3 represents a distance between the contact region 316 and the first region 311. L4 represents a distance between the second portion of the separation region 314 and the first region 311. The second portion P2 is the separation region 314 where the contact region 316 is not arranged.

With this arrangement, the electric field between the first region 311 of the first conductivity type and the contact region 316 of the second conductivity type is hardly influenced by reduction of the size of the pixel 104. That is, the increase of the DCR caused by reduction of the size of the pixel 104 can be suppressed.

Figure 8:
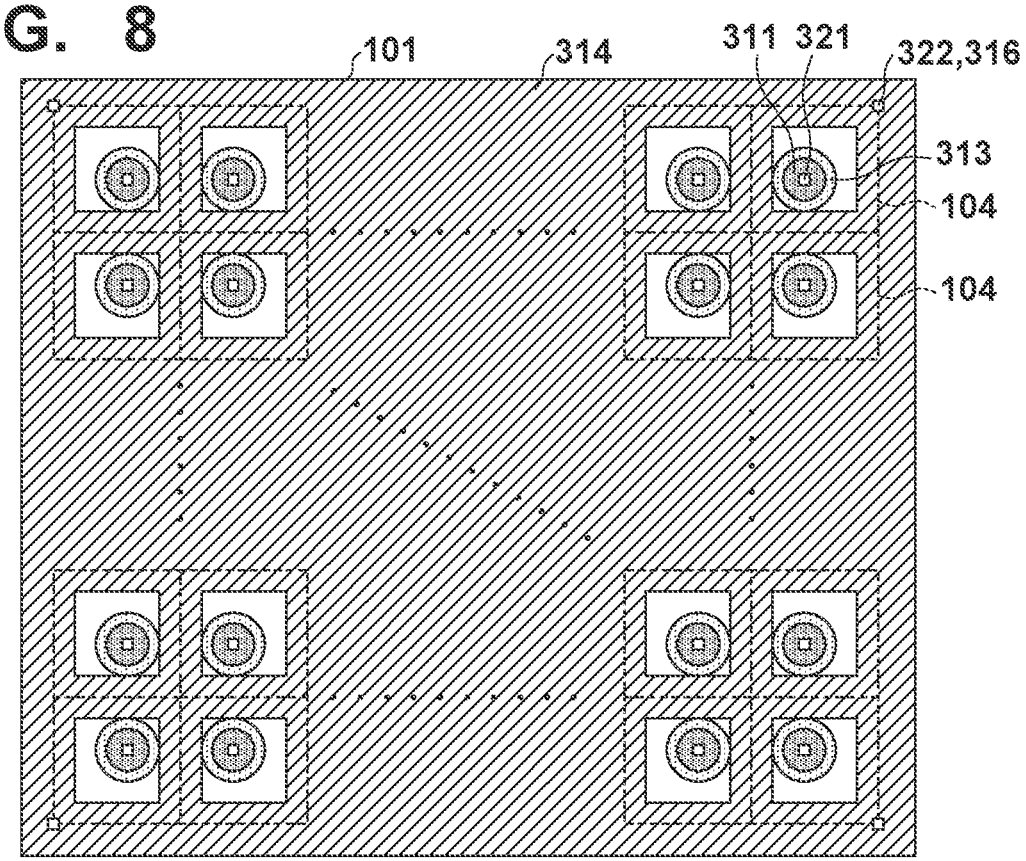
FIG. 8 is a plan view of a pixel array according to the second embodiment.

FIG. 8 shows a plan view or a planar view of a pixel array 101 according to the second embodiment.

In the second embodiment, similar to the arrangement exemplified in the first embodiment, a plurality of pixels 104 arranged in a semiconductor layer 301 form the rectangular pixel array 101. Each pixel 104 includes a photoelectric converter 102 with an APD 201. The plurality of pixels 104 are arranged in the semiconductor layer 301. A second contact plug 322 is arranged at each of positions in the diagonal directions of the pixel array 101, and the total number of second contact plugs 322 is four. The second embodiment is advantageous in reducing dark electrons from a contact region 316 to which the second contact plug 322 is electrically connected, and this is effective for reducing the DCR. In the second embodiment as well, the arrangement described with reference to FIGS. 5 and 6 can be adopted, thereby making it possible to suppress the increase of the DCR.

Figure 9:
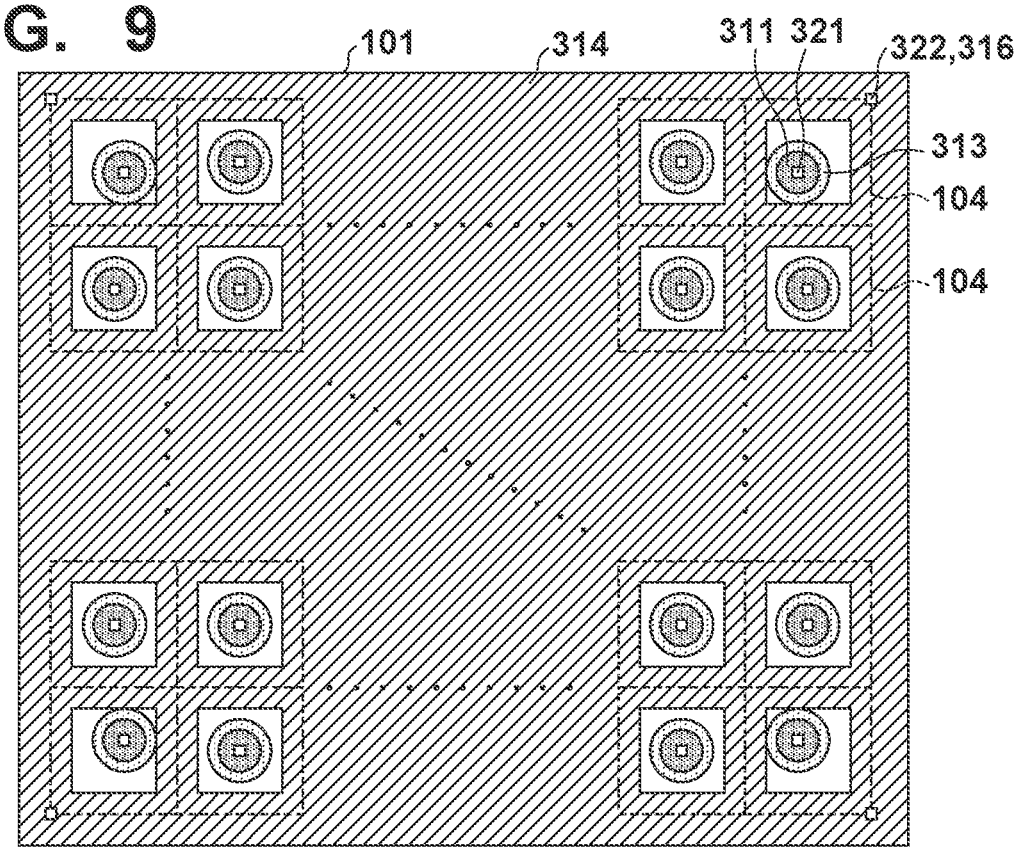
FIG. 9 is a plan view of a pixel array according to the third embodiment.

FIG. 9 shows a plan view or a planar view of a pixel array 101 according to the third embodiment.

An arrangement of the third embodiment is a modification of the second embodiment and matters not mentioned in the third embodiment can comply with the first and/or second embodiment. In the third embodiment, the arrangement described with reference to FIGS. 5 and 6 is adopted for pixels 104 at the four corners of the pixel array 101. With respect to other pixels 104, a first contact plug 321 can be arranged at the center of a second region 312 and/or a fourth region 315 but may be arranged at a position deviated from the center.

From another viewpoint, the pixels 104 other than the pixels 104 at the four corners may be arranged at equal intervals. In this arrangement, it is possible to reduce variations in time until photoelectrically converted charges are detected as signals in the plurality of pixels 104.

Figure 10:
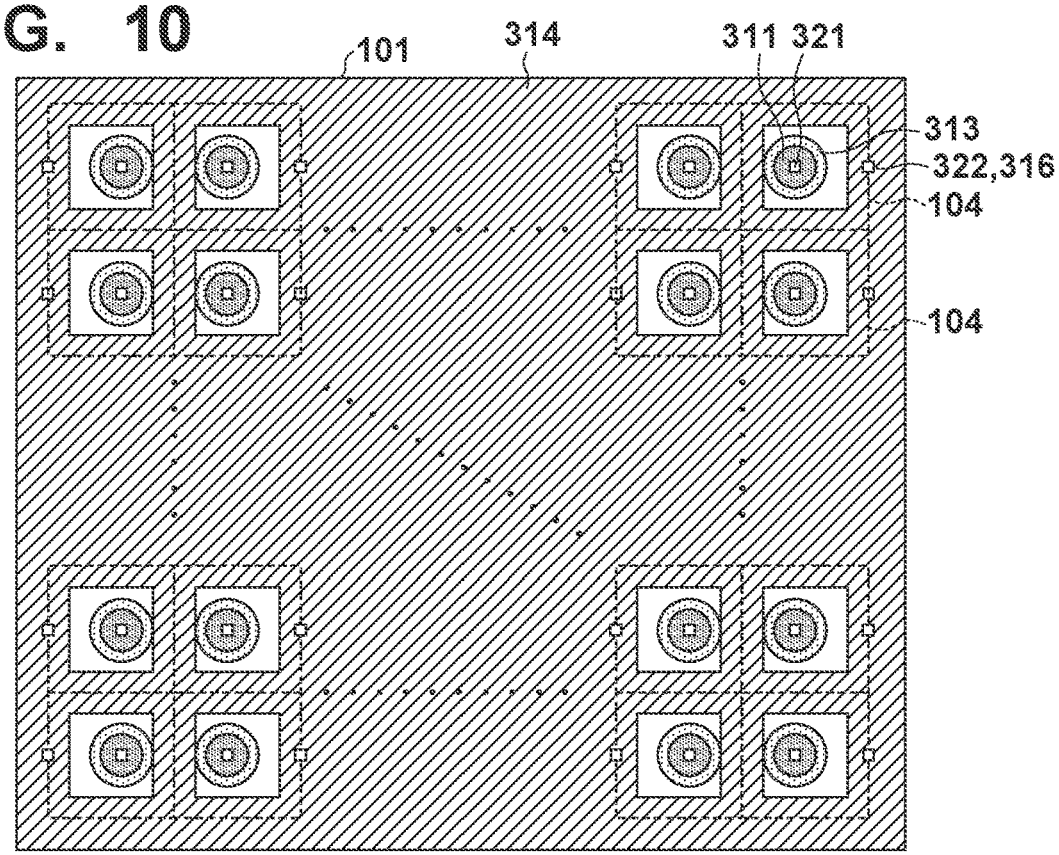
FIG. 10 is a plan view of a pixel array according to the fourth embodiment.

FIG. 10 shows a plan view or a planar view of a pixel array 101 according to the fourth embodiment. An arrangement of the fourth embodiment is a modification of the first embodiment and matters not mentioned in the fourth embodiment can comply with the first embodiment. In the fourth embodiment, similar to the arrangement exemplified in the first embodiment, a plurality of pixels 104 arranged in a semiconductor layer 301 form the rectangular pixel array 101. Each pixel 104 includes a photoelectric converter 102 with an APD 201. A photoelectric conversion device 100 according to the fourth embodiment includes a plurality of second contact plugs 322, and the plurality of second contact plugs 322 can be arranged so that two second contact plugs 322 sandwich at least two pixels 104. In one example, the plurality of second contact plugs 322 can be arranged so that two second contact plugs 322 sandwich at least two pixels 104 arrayed in a row direction (a direction orthogonal to a signal line 113). In another example, the plurality of second contact plugs 322 can be arranged so that the second contact plugs 322 sandwich at least two pixels 104. In one example, the plurality of second contact plugs 322 can be arranged so that two second contact plugs 322 sandwich at least two pixels 104 arrayed in a column direction (a direction parallel to the signal line 113). In the fourth embodiment, the arrangement described with reference to FIGS. 5 and 6 can be adopted, thereby suppressing the increase of the DCR.

In one example, the fourth embodiment can be implemented so that two second contact plugs 322 sandwich two pixels 104. In this arrangement, the number of second contact plugs 322 is larger than that in the arrangement exemplified in the first embodiment in which four pixels 104 share one second contact plug 322. This is advantageous in suppressing the voltage drop amount at the time of the operation of the APD.

Figure 11:
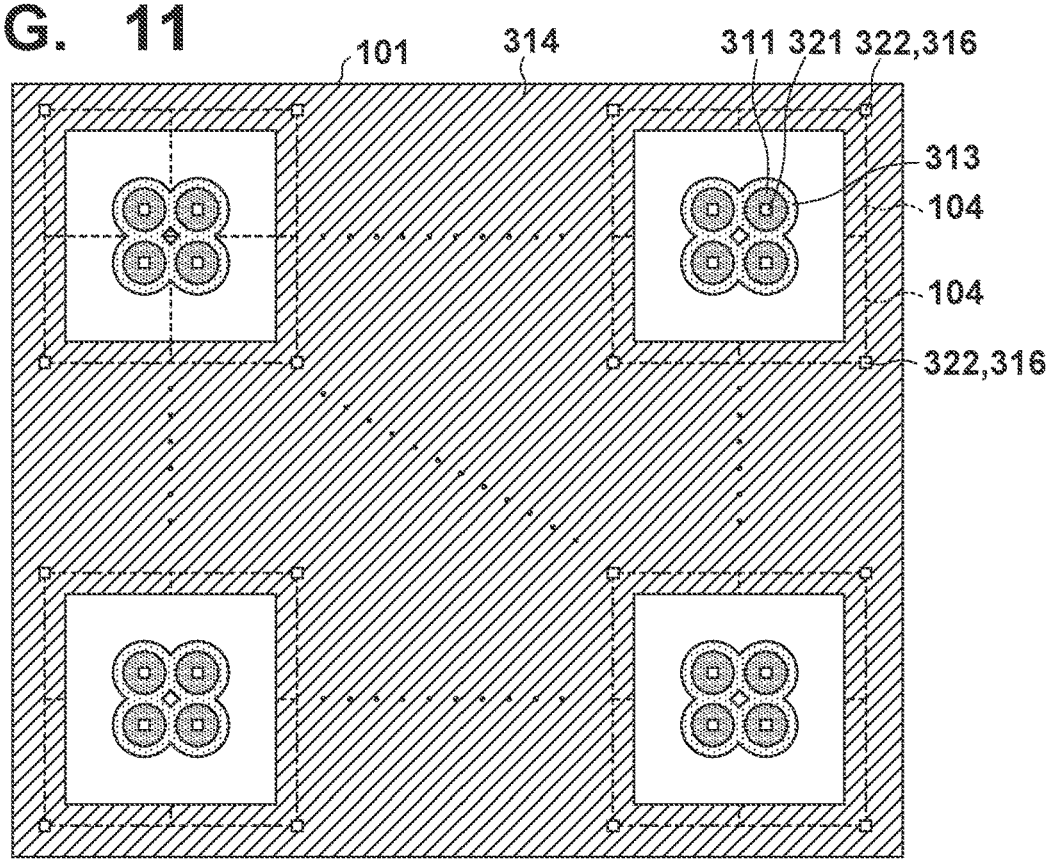
FIG. 11 is a plan view of a pixel array according to the fifth embodiment.

FIG. 11 shows a plan view or a planar view of a pixel array 101 according to the fifth embodiment. An arrangement of the fifth embodiment is a modification of the first embodiment and matters not mentioned in the fifth embodiment can comply with the first embodiment. In the fifth embodiment, similar to the arrangement exemplified in the first embodiment, a plurality of pixels 104 arranged in a semiconductor layer 301 form the rectangular pixel array 101. Each pixel 104 includes a photoelectric converter 102 with an APD 201.

In the fifth embodiment, in a group of four pixels 104 surrounded by four second contact plugs 322 arranged at the vertices of a virtual rectangle, four ring-shaped regions 313 are coupled and arranged. This arrangement is advantageous since the condition described with reference to FIG. 6 is satisfied even if the size of the pixel 104 is reduced.

Figure 12:
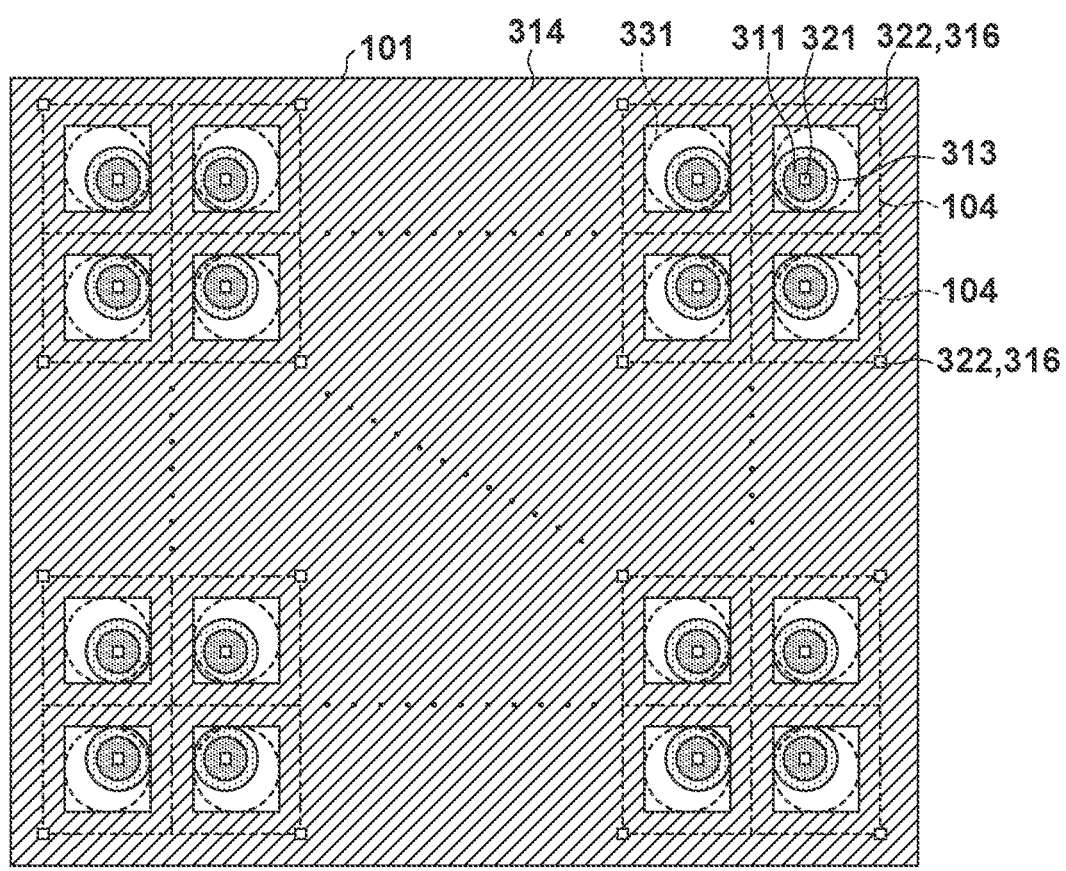
FIG. 12 is a plan view of a pixel array according to the sixth embodiment.

FIG. 12 shows a plan view or a planar view of a pixel array 101 according to the sixth embodiment. An arrangement of the sixth embodiment is a modification or application of each of the first to fifth embodiments and matters not mentioned in the sixth embodiment can comply with the first embodiment. In the sixth embodiment, similar to the arrangement exemplified in the first embodiment, a plurality of pixels 104 arranged in a semiconductor layer 301 form the rectangular pixel array 101. Each pixel 104 includes a photoelectric converter 102 with an APD 201. A photoelectric conversion device 100 according to the sixth embodiment includes a microlens 331 in each pixel 104. The microlens 331 can be provided on, for example, the side of a first surface S1 but may be provided on the side of a second surface S2. If the microlens 331 is provided on the side of the first surface S1, the first surface S1 is located between the microlens 331 and the second surface S2.

If the microlens 331 is provided on the side of the second surface S2, the second surface S2 is located between the microlens 331 and the first surface S1.

In an orthogonal projection with respect to the first surface S1, the microlens 331 can be arranged so that the center of the microlens 331 matches the center of a second region 312. Alternatively, in the orthogonal projection with respect to the first surface S1, the microlens 331 can be arranged so that the center of the microlens 331 matches the center of a third region 300.

In one example, the first contact plug 321 can be arranged so that the center of the first contact plug 321 deviates from the center of the second region 312, and the microlens 331 can be arranged so that the center of the microlens 331 matches the center of the second region 312. In one example, the first contact plug 321 can be arranged so that the center of the first contact plug 321 deviates from the center of the third region 300, and the microlens 331 can be arranged so that the center of the microlens 331 matches the center of the third region 300. This arrangement is advantageous since the APD 201 efficiently receives light or photons when the microlens 331 is provided on the side of the first surface S1.

Figure 13:
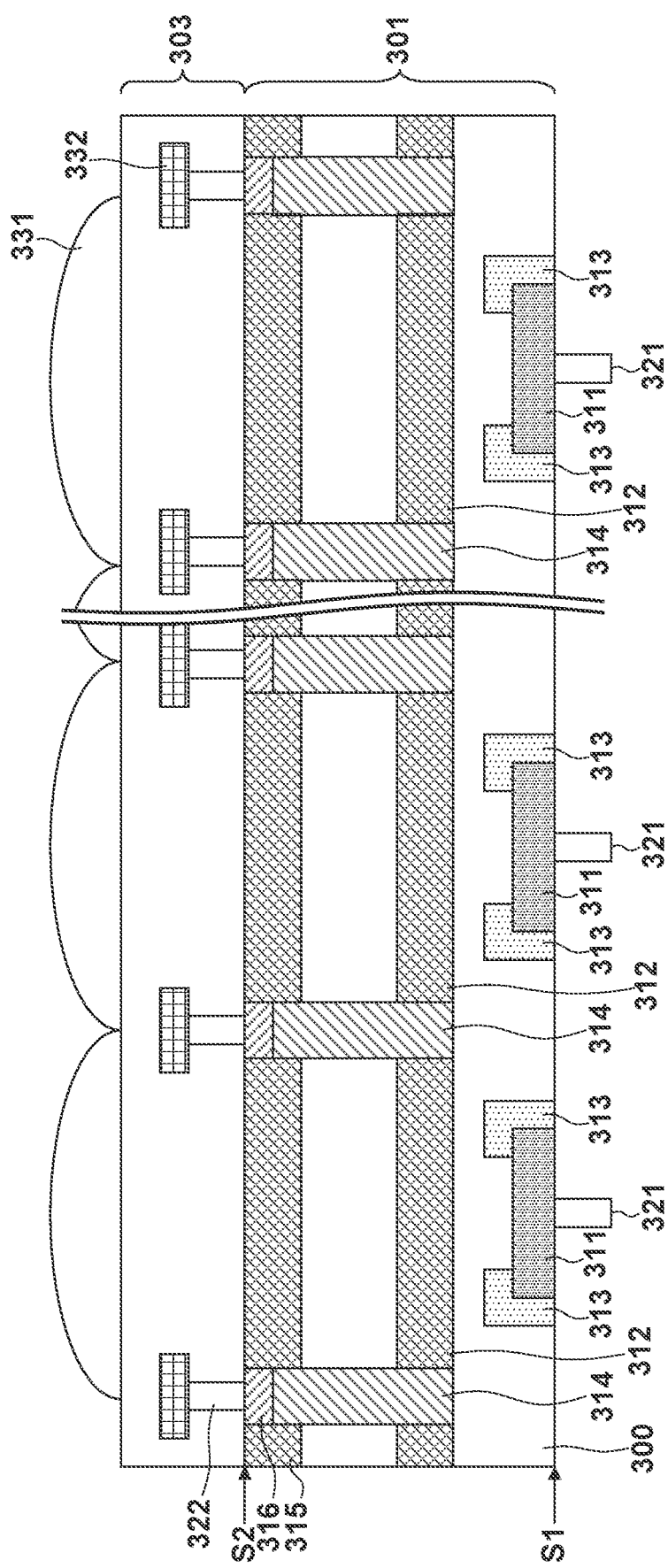
FIG. 13 is a plan view of the seventh embodiment of a pixel array.

FIG. 13 shows a plan view or a planar view of a pixel array 101 according to the seventh embodiment. An arrangement of the seventh embodiment is a modification or application of each of the first to sixth embodiments and matters not mentioned in the seventh embodiment can comply with the first embodiment. In the seventh embodiment, similar to the arrangement exemplified in the first embodiment, a plurality of pixels 104 arranged in a semiconductor layer 301 form the rectangular pixel array 101. The seventh embodiment provides an example of a photoelectric conversion device 100 formed as a back-side illumination type. A contact region 316 is arranged on the side of a second surface S2, and a second contact plug 322 is also arranged on the side of the second surface S2. For example, a voltage line 332 for supplying a voltage VL is electrically connected to the second contact plug 322. In this arrangement, an electric field between a first region 311 of the first conductivity type and the contact region 316 of the second conductivity type is irrelevant to reduction of the size of the pixel 104. Therefore, it is possible to suppress the increase of the DCR caused by reduction of the size of the pixel 104.

The contact region 316 can be arranged to contact a separation region 314. Furthermore, the contact region 316 can be arranged to contact a fourth region 315. In one example, the side surface of the contact region 316 contacts the fourth region 315 and is surrounded by the fourth region 315. In another example, the side surface of the contact region 316 contacts the separation region 314 and is surrounded by the separation region 314.

The end face of the separation region 314 on the side of a first surface S1 can be arranged between the first surface S1 and the second surface S2. From another viewpoint, the end face of the separation region 314 on the side of the first surface S1 can be arranged apart from the first surface S1. In this arrangement, an electric field between the first region 311 of the first conductivity type and the separation region 314 of the second conductivity type is hardly influenced by reduction of the size of the pixel 104. That is, it is possible to suppress the increase of the DCR caused by reduction of the size of the pixel 104.

In another example, the end face of the separation region 314 on the side of the first surface S1 may match the first surface S1. This arrangement is advantageous in improving the separation characteristic between the pixels 104.

An example of a photoelectric conversion system using a photoelectric conversion device of each of the above-described embodiments will be described below.

Figure 14:
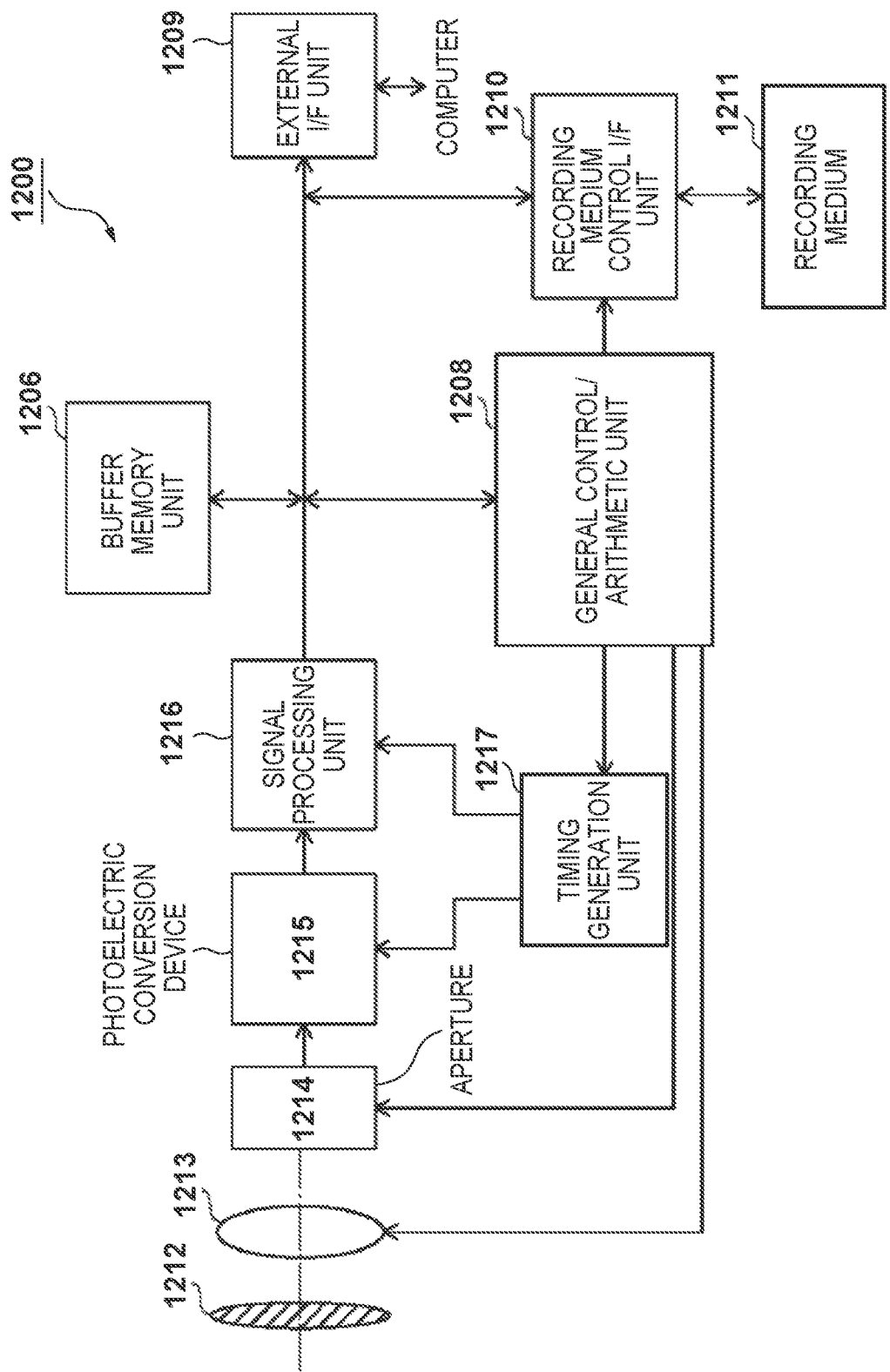
FIG. 14 is a block diagram showing the arrangement of a photoelectric conversion system according to an embodiment.

FIG. 14 is a block diagram showing the arrangement of a photoelectric conversion system 1200 according to this embodiment. The photoelectric conversion system 1200 according to this embodiment includes a photoelectric conversion device 1215. Any one of the photoelectric conversion devices described in the above embodiments can be applied as the photoelectric conversion device 1215. The photoelectric conversion system 1200 can be used as, for example, an image capturing system. Practical examples of the image capturing system are a digital still camera, a digital camcorder, and a monitoring camera. FIG. 14 shows an example of a digital still camera as the photoelectric conversion system 1200.

The photoelectric conversion system 1200 shown in FIG. 14 includes the photoelectric conversion device 1215, a lens 1213 for forming an optical image of an object on the photoelectric conversion device 1215, an aperture 1214 for changing the amount of light passing through the lens 1213, and a barrier 1212 for protecting the lens 1213. The lens 1213 and aperture 1214 form an optical system for concentrating light to the photoelectric conversion device 1215.

The photoelectric conversion system 1200 includes a signal processor 1216 for processing an output signal output from the photoelectric conversion device 1215. The signal processor 1216 performs an operation of signal processing of performing various kinds of correction and compression for an input signal, as needed, thereby outputting the resultant signal. The photoelectric conversion system 1200 further includes a buffer memory unit 1206 for temporarily storing image data and an external interface unit (external I/F unit) 1209 for communicating with an external computer or the like.

Furthermore, the photoelectric conversion system 1200 includes a recording medium 1211 such as a semiconductor memory for recording or reading out image capturing data, and a recording medium control interface unit (recording medium control I/F unit) 1210 for performing a recording or readout operation in or from the recording medium 1211. The recording medium 1211 may be incorporated in the photoelectric conversion system 1200 or may be detachable.

In addition, communication with the recording medium 1211 from the recording medium control I/F unit 1210 or communication from the external I/F unit 1209 may be performed wirelessly.

Furthermore, the photoelectric conversion system 1200 includes a general control/arithmetic unit 1208 that controls various kinds of operations and the entire digital still camera, and a timing generation unit 1217 that outputs various kinds of timing signals to the photoelectric conversion device 1215 and the signal processor 1216. In this example, the timing signal and the like may be input from the outside, and the photoelectric conversion system 1200 need only include at least the photoelectric conversion device 1215 and the signal processor 1216 that processes an output signal output from the photoelectric conversion device 1215. As described in the fourth embodiment, the timing generation unit 1217 may be incorporated in the photoelectric conversion device. The general control/arithmetic unit 1208 and the timing generation unit 1217 may be configured to perform some or all of the control functions of the photoelectric conversion device 1215.

The photoelectric conversion device 1215 outputs an image signal to the signal processor 1216. The signal processor 1216 performs predetermined signal processing for the image signal output from the photoelectric conversion device 1215 and outputs image data. The signal processor 1216 also generates an image using the image signal. Furthermore, the signal processor 1216 may perform distance measurement calculation for the signal output from the photoelectric conversion device 1215. Note that the signal processor 1216 and the timing generation unit 1217 may be incorporated in the photoelectric conversion device. That is, each of the signal processor 1216 and the timing generation unit 1217 may be provided on a substrate on which pixels are arranged or may be provided on another substrate. An image capturing system capable of acquiring a higher-quality image can be implemented by forming an image capturing system using the photoelectric conversion device of each of the above-described embodiments.

Figure 15A:
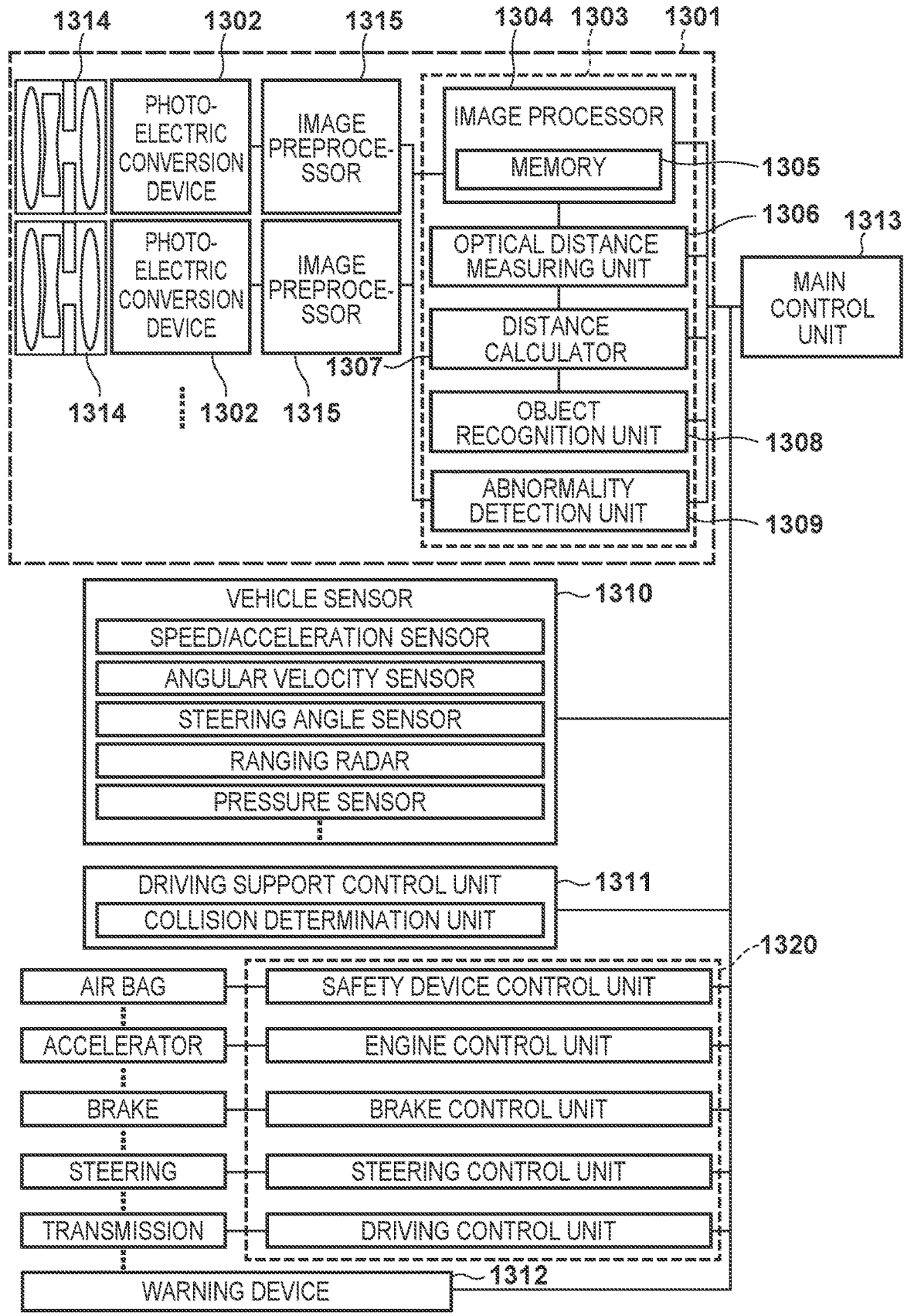
FIGS. 15A and 15B show views of the arrangement of a vehicle system and a photoelectric conversion system that is incorporated in the vehicle system and performs image capturing according to an embodiment.
Figure 15B:
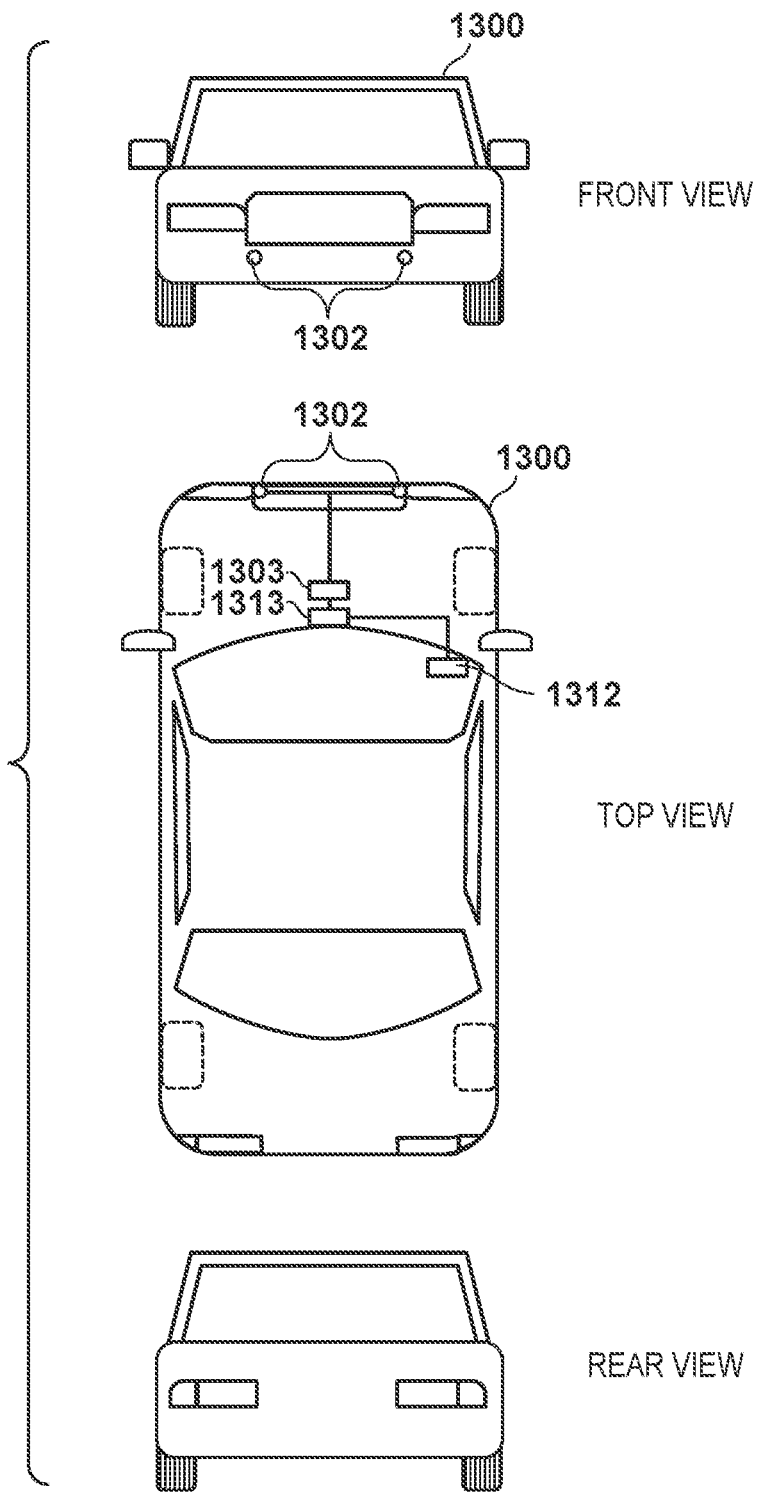
Figure 16:
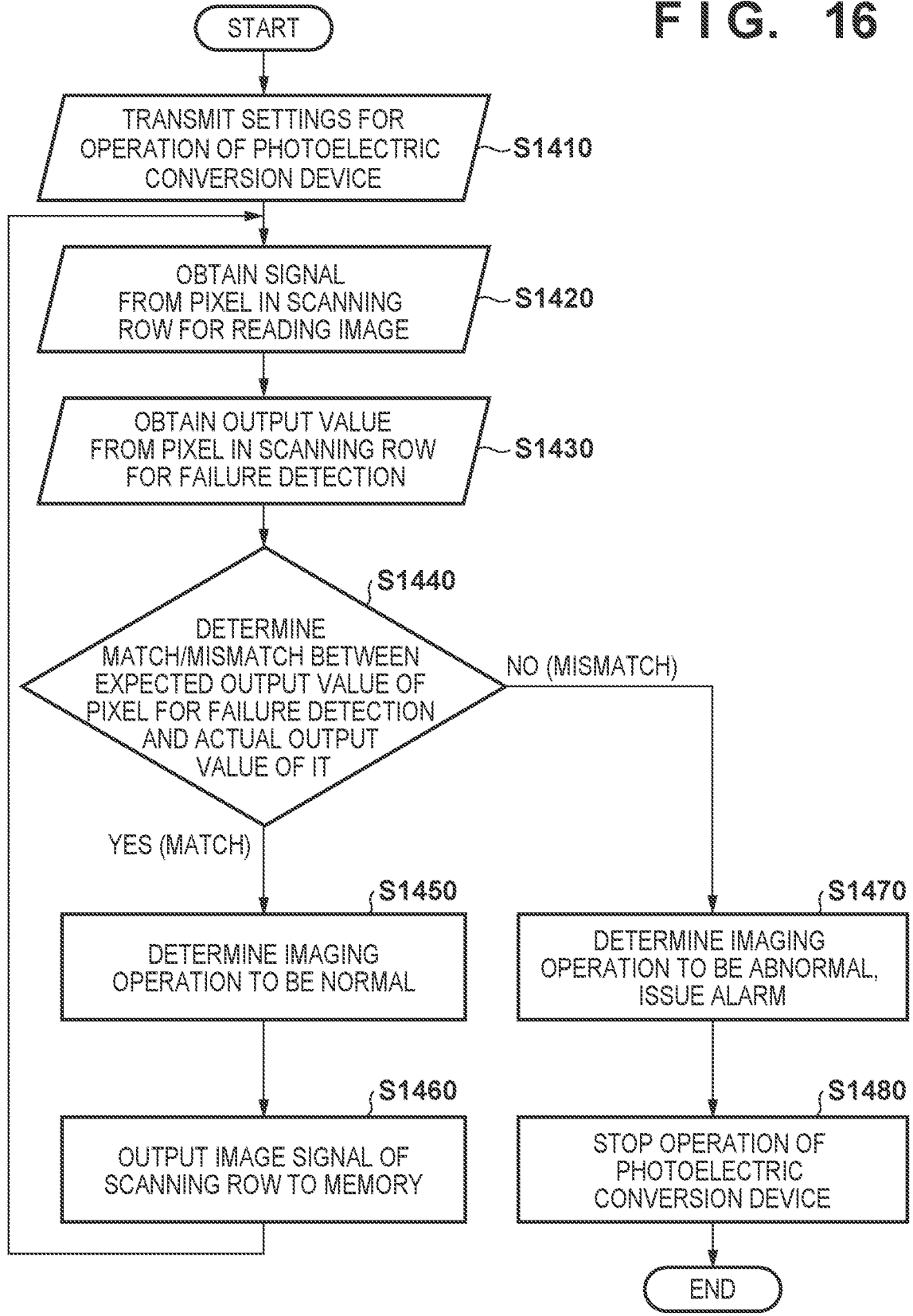
FIG. 16 is a flowchart illustrating the operation of the photoelectric conversion system shown in FIGS. 15A and 15B.

The photoelectric conversion system and a moving body according to this embodiment will be described with reference to FIGS. 15A, 15B and 16. FIGS. 15A and 15B are schematic views showing an example of the arrangement of the photoelectric conversion system and the moving body according to this embodiment. FIG. 16 is a flowchart illustrating the operation of the photoelectric conversion system according to this embodiment. This embodiment will describe an example of an in-vehicle camera as the photoelectric conversion system.

FIGS. 15A and 15B show examples of a vehicle system and a photoelectric conversion system that is incorporated in the vehicle system and performs image capturing. A photoelectric conversion system 1301 includes a photoelectric conversion device 1302, an image preprocessing unit 1315, an integrated circuit 1303, and an optical system 1314. The optical system 1314 forms an optical image of an object on the photoelectric conversion device 1302. The photoelectric conversion device 1302 converts, into an electrical signal, the optical image of the object formed by the optical system 1314. The photoelectric conversion device 1302 is one of the photoelectric conversion devices according to the above-described embodiments. The image preprocessing unit 1315 performs predetermined signal processing for the signal output from the photoelectric conversion device 1302. The function of the image preprocessing unit 1315 may be incorporated in the photoelectric conversion device 1302. In the photoelectric conversion system 1301, at least two sets of the optical systems 1314, the photoelectric conversion devices 1302, and the image preprocessing units 1315 are arranged, and an output from the image preprocessing unit 1315 of each set is input to the integrated circuit 1303.

The integrated circuit 1303 is an image capturing system application specific integrated circuit, and includes an image processing unit 1304 with a memory 1305, an optical distance measurement unit 1306, a distance measurement calculation unit 1307, an object recognition unit 1308, and an abnormality detection unit 1309. The image processing unit 1304 performs image processing such as development processing and defect correction for the output signal from each image preprocessing unit 1315. The memory 1305 temporarily stores a captured image, and stores the position of a defect in the captured image. The optical distance measurement unit 1306 performs focusing or distance measurement of an object. The distance measurement calculation unit 1307 calculates distance measurement information from a plurality of image data acquired by the plurality of photoelectric conversion devices 1302. The object recognition unit 1308 recognizes objects such as a vehicle, a road, a road sign, and a person. Upon detecting an abnormality of the photoelectric conversion device 1302, the abnormality detection unit 1309 notifies a main controller 1313 of the abnormality.

The integrated circuit 1303 may be implemented by dedicated hardware, a software module, or a combination thereof. Alternatively, the integrated circuit may be implemented by an FPGA (Field Programmable Gate Array), an ASIC (Application Specific Integrated Circuit), or a combination thereof.

The main controller 1313 comprehensively controls the operations of the photoelectric conversion system 1301, vehicle sensors 1310, a controller 1320, and the like. A method in which the photoelectric conversion system 1301, the vehicle sensors 1310, and the controller 1320 each individually include a communication interface and transmit/receive control signals via a communication network (for example, CAN standards) may be adopted without providing the main controller 1313.

The integrated circuit 1303 has a function of transmitting a control signal or a setting value to each photoelectric conversion device 1302 by receiving the control signal from the main controller 1313 or by its own controller.

The photoelectric conversion system 1301 is connected to the vehicle sensors 1310 and can detect the traveling state of the self-vehicle such as the vehicle speed, the yaw rate, and the steering angle, the external environment of the self-vehicle, and the states of other vehicles and obstacles. The vehicle sensors 1310 also serve as a distance information acquisition unit that acquires distance information to a target object. Furthermore, the photoelectric conversion system 1301 is connected to a driving support controller 1311 that performs various driving support operations such as automatic steering, adaptive cruise control, and anti-collision function. More specifically, with respect to a collision determination function, based on the detection results from the photoelectric conversion system 1301 and the vehicle sensors 1310, a collision with another vehicle or an obstacle is estimated or the presence/absence of a collision is determined. This performs control to avoid a collision when the collision is estimated or activates a safety apparatus at the time of a collision.

Furthermore, the photoelectric conversion system 1301 is also connected to an alarm device 1312 that generates an alarm to the driver based on the determination result of a collision determination unit. For example, if the determination result of the collision determination unit indicates that the possibility of a collision is high, the main controller 1313 performs vehicle control to avoid a collision or reduce damage by braking, releasing the accelerator pedal, or suppressing the engine output. The alarm device 1312 sounds an alarm such as a sound, displays alarm information on the screen of a display unit such as a car navigation system or a meter panel, applies a vibration to the seat belt or a steering wheel, thereby giving an alarm to the user.

The present invention is not limited to the above embodiments and various changes and modifications can be made within the spirit and scope of the present invention. Therefore, to apprise the public of the scope of the present invention, the following claims are made.

According to the present invention, there is provided a technique advantageous in suppressing the increase of the DCR caused by a high electric field in the APD.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-008942 filed Jan. 22, 2021, which is hereby incorporated by reference herein in its entirety.

What is claimed is:

1. A photoelectric conversion device comprising:
   a first region of a first conductivity type arranged in a semiconductor layer having a first surface and a second surface;
   a second region of a second conductivity type arranged between the second surface and the first region and forming an avalanche photodiode together with the first region;
   a separation region of the second conductivity type arranged between the first surface and the second surface to surround the second region in an orthogonal projection with respect to the first surface;
   a contact region of the second conductivity type arranged to contact the separation region;
   a first contact plug connected to the first region; and
   a second contact plug connected to the contact region,
   wherein the second region has a shape of a rectangle, and the second contact plug is arranged in a diagonal direction of the rectangle, and
   in the orthogonal projection with respect to the first surface, a distance between a center of the first contact plug and a center of the second contact plug is larger than a distance between a center of the second region and the center of the second contact plug.

2. The device according to claim 1, wherein the number of second contact plugs is smaller than the number of first contact plugs.

3. The device according to claim 1, wherein
   a plurality of pixels are arranged in the semiconductor layer so that one pixel includes one avalanche photodiode, and
   at least two pixels share the second contact plug.

4. The device according to claim 3, wherein the at least two pixels sharing the second contact plug are arranged to have symmetry with respect to the second contact plug.

5. The device according to claim 3, further comprising a microlens,
   wherein in the orthogonal projection, a center of the microlens matches the center of the second region.

6. The device according to claim 1, wherein
   a plurality of pixels are arranged in the semiconductor layer so that one pixel includes one avalanche photodiode, and
   the second contact plug is surrounded by four pixels among the plurality of pixels and shared by the four pixels.

7. The device according to claim 1, wherein
   a plurality of pixels are arranged in the semiconductor layer so that one pixel includes one avalanche photodiode,
   the plurality of pixels are arranged to form a rectangular pixel array, and
   the second contact plug is arranged at each of positions in diagonal directions of the pixel array.

8. The device according to claim 1, wherein
   a plurality of pixels are arranged in the semiconductor layer so that one pixel includes one avalanche photodiode,
   the plurality of pixels are arranged to form a rectangular pixel array, and
   the two contact plugs sandwich at least two of the plurality of pixels.

9. The device according to claim 1, wherein the second region is arranged apart from the first region.

10. The device according to claim 9, further comprising a ring-shaped region arranged to cover a side surface of the first region and having an impurity concentration of the first conductivity type lower than an impurity concentration of the first conductivity type of the first region.

11. The device according to claim 10, wherein the second region is arranged apart from the ring-shaped region.

12. The device according to claim 10, wherein the separation region is arranged apart from the ring-shaped region.

13. The device according to claim 10, wherein the ring-shaped region of one pixel is coupled to the ring-shaped region of another pixel.

14. The device according to claim 10, wherein
a third region of the first conductivity type is provided between the first region and the second region and between the ring-shaped region and the second region, and
an impurity concentration of the first conductivity type of the third region is lower than the impurity concentration of the first conductivity type of the ring-shaped region.

15. The device according to claim 10, wherein
a third region of the second conductivity type is provided between the first region and the second region and between the ring-shaped region and the second region, and
an impurity concentration of the second conductivity type of the third region is lower than impurity concentrations of the second conductivity type of the second region and the separation region.

16. A photoelectric conversion device comprising:
a plurality of first regions of a first conductivity type arranged in a semiconductor layer having a first surface and a second surface;
a plurality of second regions of a second conductivity type arranged between the second surface and the first region and each forming an avalanche photodiode together with a corresponding one of the plurality of first regions;
a separation region of the second conductivity type arranged between the first surface and the second surface to surround the plurality of second regions in an orthogonal projection with respect to the first surface;
a contact region of the second conductivity type arranged to contact the separation region;
a plurality of first contact plugs connected to the plurality of first regions, respectively; and
a second contact plug connected to the contact region,
wherein the second region has a shape of a rectangle, and the second contact plug is arranged in a diagonal direction of the rectangle, and
in the orthogonal projection with respect to the first surface, L1>0.5L2 is satisfied when L1 represents a distance between a center of the second contact plug and a center of a recent first contact plug closest to the second contact plug among the plurality of first contact plugs, and L2 represents a distance between a recent first region connected to the recent first contact plug among the plurality of first regions and an adjacent first region closest to the recent first region among the plurality of first regions on a straight line passing through the center of the second contact plug and the center of the recent first contact plug.

17. A photoelectric conversion device comprising:
a first region of a first conductivity type arranged in a semiconductor layer having a first surface and a second surface;
a second region of a second conductivity type arranged between the second surface and the first region and forming an avalanche photodiode together with the first region;
a separation region of the second conductivity type arranged between the first surface and the second surface to surround the second region in an orthogonal projection with respect to the first surface;
a contact region of the second conductivity type arranged to contact the separation region;
a first contact plug connected to the first region; and
a second contact plug connected to the contact region,
wherein the second region has a shape of a rectangle, and the second contact plug is arranged in a diagonal direction of the rectangle,
in the orthogonal projection with respect to the first surface, the first region is arranged to be located between the contact region arranged to contact a first portion of the separation region and a second portion of the separation region, and
in the orthogonal projection with respect to the first surface, a distance between the contact region and the first region is larger than a distance between the second portion and the first region on a straight line passing through the first portion, the contact region, the first region, and the second portion.

18. A photoelectric conversion system comprising:
a photoelectric conversion device defined in claim 1; and
a signal processor configured to process a signal output from the photoelectric conversion device.

19. A moving body including a photoelectric conversion device defined in claim 1 and a distance information acquisition unit configured to acquire distance information to a target object from the distance information based on a signal from the photoelectric conversion device, the moving body further comprising:
a controller configured to control the moving body based on the distance information.

* * * * *